United States Patent
Takiguchi et al.

(10) Patent No.: US 7,907,197 B2
(45) Date of Patent: Mar. 15, 2011

(54) SOLID-STATE IMAGING DEVICE AND SOLID-STATE IMAGING APPARATUS

(75) Inventors: Ryo Takiguchi, Fukuoka (JP); Shogo Numaguchi, Fukuoka (JP); Hiroaki Tanaka, Fukuoka (JP); Isao Hirota, Kanagawa (JP)

(73) Assignee: Sony Corporation, Tokyo (JP)

( * ) Notice: Subject to any disclaimer, the term of this patent is extended or adjusted under 35 U.S.C. 154(b) by 650 days.

(21) Appl. No.: 12/018,874

(22) Filed: Jan. 24, 2008

(65) Prior Publication Data

US 2008/0179634 A1    Jul. 31, 2008

(30) Foreign Application Priority Data

Jan. 30, 2007  (JP) .................................. 2007-019356

(51) Int. Cl.
    *H04N 3/14* (2006.01)
    *H04N 5/335* (2006.01)
    *H01L 29/04* (2006.01)
    *H01L 29/10* (2006.01)
    *H01L 31/00* (2006.01)
    *H01L 27/148* (2006.01)

(52) U.S. Cl. .......... 348/316; 348/315; 257/59; 257/225; 257/249

(58) Field of Classification Search .......... 348/311–324; 257/215–251, 59, 72
See application file for complete search history.

(56) References Cited

U.S. PATENT DOCUMENTS

| | | | | |
|---|---|---|---|---|
| 6,541,794 B1 * | 4/2003 | Patterson et al. | ............... | 257/59 |
| 6,791,521 B2 * | 9/2004 | Isami et al. | ............... | 345/89 |
| 6,803,960 B2 * | 10/2004 | Shepherd et al. | ............ | 348/315 |
| 7,164,447 B2 * | 1/2007 | Takahashi | ............... | 348/350 |
| 7,589,349 B2 * | 9/2009 | Hong | ............... | 257/69 |
| 7,592,652 B2 * | 9/2009 | Kimura | ............... | 257/249 |
| 7,612,392 B2 * | 11/2009 | Jung et al. | ............... | 257/225 |

FOREIGN PATENT DOCUMENTS

JP    2004-096546    3/2004

* cited by examiner

*Primary Examiner* — Jason Chan
*Assistant Examiner* — Pritham Prabhakher
(74) *Attorney, Agent, or Firm* — SNR Denton US LLP

(57) ABSTRACT

A solid-state imaging device is provided. The imaging device includes an imaging portion which includes light receiving portions and vertical transfer registers, a horizontal transfer portion, an output part for outputting an electrical signal converted from electric charges transferred from the horizontal transfer portion, a first reference potential applying means, and a second reference potential applying means. The imaging portion, the horizontal transfer portion and the output part are formed in a first conductivity type semiconductor substrate having a second conductivity type region, and a reference potential is applied to the second conductivity type semiconductor region. The first reference potential applying means applies a reference potential to the second conductivity type semiconductor region corresponding to an area where the output part is formed. The second reference potential applying means applies a reference potential to the second conductivity type semiconductor region corresponding to an area where the imaging portion is formed.

13 Claims, 6 Drawing Sheets

- P-TYPE WELL (GND) REGION
- N-TYPE WELL REGION
- LIGHT SHIELDING REGION
- Al WIRING
- --- CONTACT

SOLID-STATE IMAGING DEVICE AND SOLID-STATE IMAGING APPARATUS

BACKGROUND OF THE INVENTION

1. Field of the Invention

The present invention relates to a solid-state imaging device and a solid-state imaging apparatus. More particularly, it relates to a solid-state imaging device and a solid-state imaging apparatus capable of realizing a high frame rate.

2. Description of Related Art

In a video camera and a digital still camera, a CCD type solid-state imaging device using CCD registers in a charge transfer part has been used (refer to Japanese Unexamined Patent Application Publication NO. 2004-96546).

This CCD type solid-state imaging device has a plurality of pixels with photoelectric conversion elements (photodiodes: PD) two-dimensionally disposed in a matrix shape in an imaging area of a semiconductor substrate. Light incident upon each pixel is photoelectrically converted by the photodiode to generate electric charges, the electric charges are transferred to a floating diffusion (FD) region of an output part via a vertical transfer register and a horizontal transfer portion, a potential change in the FD region is detected by a MOS transistor, and this potential change is converted into an electric signal which is amplified and outputted as a video signal.

Figure 5A:
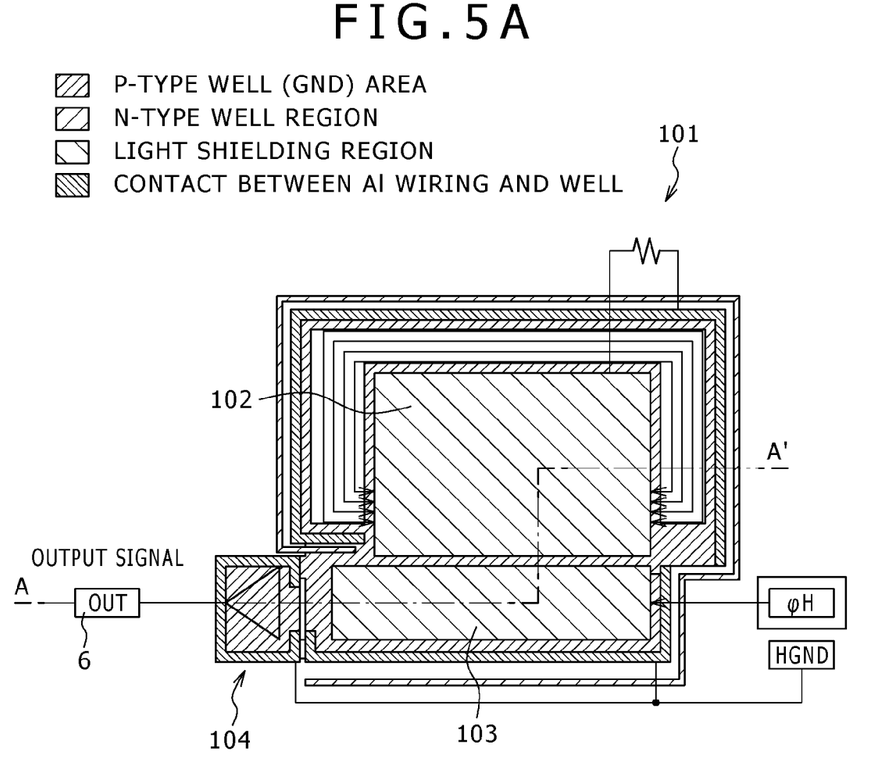
FIG. 5A is a schematic plan view showing a CCD type solid-state imaging device.
Figure 5B:
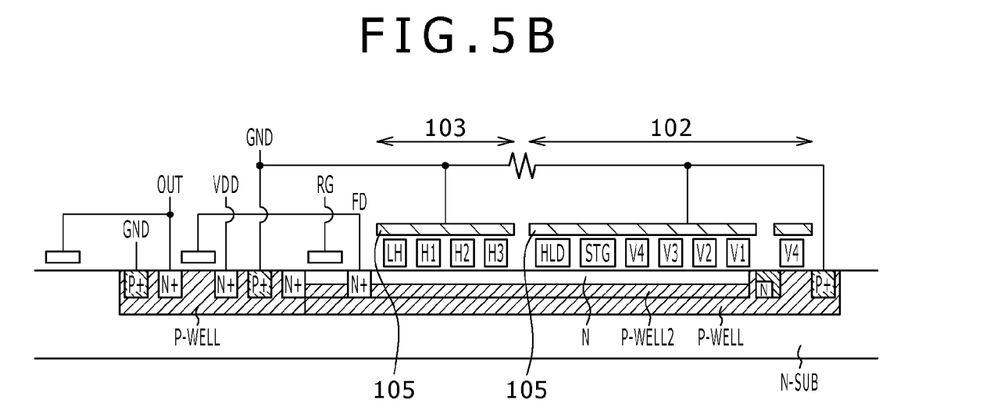
FIG. 5B is a schematic cross sectional view taken along line A-A' in FIG. 5A.

FIG. 5A is a schematic plan view showing a known CCD type solid-state imaging device, and FIG. 5B is a schematic cross sectional view taken along line A-A' in FIG. 5A. This CCD type solid-state imaging device 101 is mainly constituted of an image area 102, a horizontal transfer portion 103 and an output part 104. The image area is constituted of light receiving portions (not shown) disposed in a matrix shape and a vertical transfer register (not shown) disposed in each vertical column of the respective light receiving portions to transfer charges from the respective light receiving portions. A light shielding film 105 is formed above the image area and the horizontal transfer portion.

The CCD type solid-state imaging device is formed on an n-type semiconductor substrate (N-sub) having a P-well region. A single ground potential supply source (GND) applies a ground potential to: a P-well region corresponding to the image area (the P-well region corresponding to the image area is hereinafter called an "image area P-well region"); a P-well region corresponding to the horizontal transfer portion (the P-well region corresponding to the horizontal transfer portion is hereinafter called a "horizontal transfer portion P-well region"); a P-well region corresponding to the output part (the P-well region corresponding to the output part is hereinafter called an "output part P-well region"); and the light shielding film. An N-well region is formed in an area corresponding to a pad 107 for applying a horizontal transfer clock.

In the CCD type solid-state imaging device constructed as above, electric charges read from the light receiving portions to the vertical transfer registers are transferred in a vertical direction, upon application of vertical transfer clocks from a timing signal generator circuit (not shown) to the vertical transfer registers. Electric charges transferred to the horizontal transfer portion are transferred in a horizontal direction, upon application of horizontal transfer clocks from the timing signal generator circuit to the horizontal transfer portion. The electric charges from the horizontal transfer portion are converted into a voltage in the FD region, and this voltage is read from the output part as an optical reception signal.

Because of recent market need for high image quality, the trend towards larger numbers of pixels in a CCD type solid-state imaging device has accelerated. There has also been a growing need for capturing a large number of images at the same time in a short time. It is therefore desired to realize a CCD type solid-state imaging device having a large number of pixels and a frame rate about the same degree as currently used frame rate.

A method of realizing a CCD type solid-state imaging device having a large number of pixels and a frame rate about the same degree as currently used frame rate may be (1) a method of raising a drive frequency for driving a CCD type solid imaging device and (2) a method of performing vertical transfer during an effective pixel period.

However, if a frame rate about the same degree as currently used frame rate is realized by raising a drive frequency for driving a CCD type solid-state imaging device, there may lead to problems such as an increase in a heat generation due to raising the drive frequency, an increase in a consumption power, an expensive substrate of the CCD type solid-state imaging device, an increase in the number of peripheral components. The realization of the frame rate about the same degree as currently used frame rate by raising a drive frequency for driving a CCD type solid imaging device, is hardly a satisfactory method. Furthermore, adopting only the countermeasure of raising a drive frequency is near at a limit relative to recent need for improvement on a frame rate.

If a frame rate about the same degree as currently used frame rate is realized by performing vertical transfer during an effective pixel period, there is a possibility of generation of crosstalk noises as indicated in the following [1] to [5].

[1]

Figure 6:
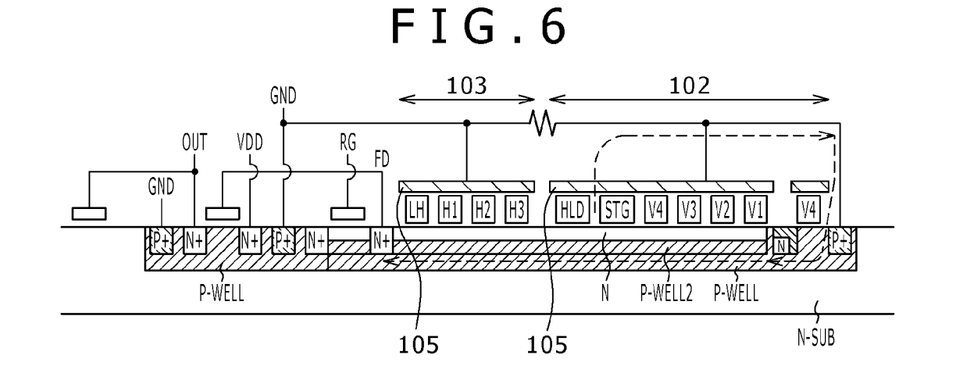
FIG. 6 is a diagram illustrating generation of crosstalk noises.

As shown in FIG. 6, crosstalk noises are generated in the image area at the rise and fall of a vertical transfer clock during vertical transfer in the effective pixel period, and propagated to the image area P-well region via the light shielding film in the image area. The crosstalk noise propagated to the image area P-well region is propagated to the output part P-well region. Crosstalk noises are therefore generated in an output signal of the CCD type solid-state imaging device, due to the back gate effects.

[2]

Figure 7:
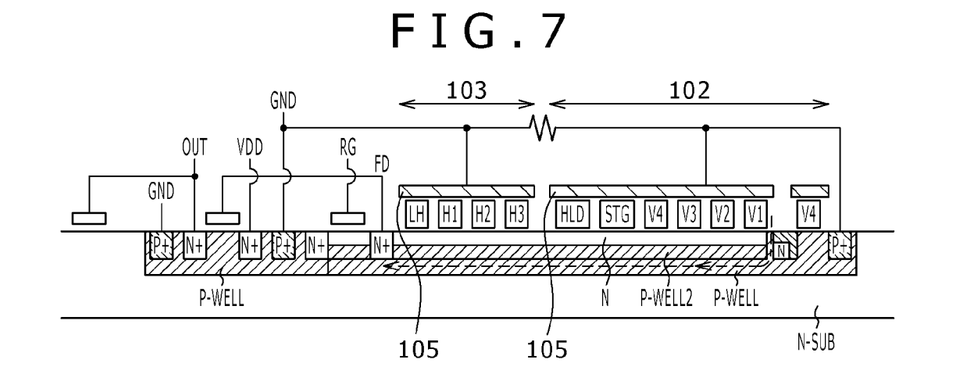
FIG. 7 is a diagram illustrating generation of crosstalk noises.

As shown in FIG. 7, crosstalk noises are generated in the image area at the rise and fall of a vertical transfer clock during vertical transfer in the effective pixel period, and propagated to channel stop regions of the light receiving parts and the image area P-well region. The crosstalk noises propagated to the image area P-well region are propagated to the output part P-well region. Crosstalk noises are therefore generated in an output signal of the CCD type solid-state imaging device due to the back gate effects.

[3]

Figure 8:
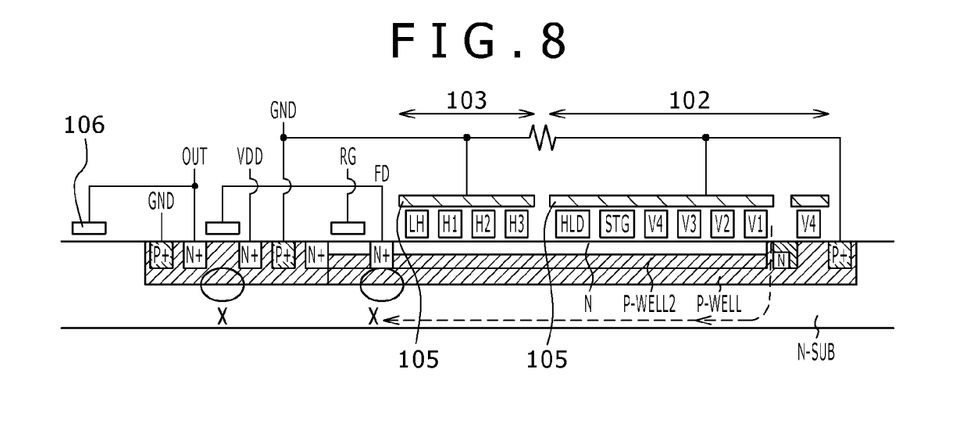
FIG. 8 is a diagram illustrating generation of crosstalk noises.

As shown in FIG. 8, crosstalk noises are generated in the image area at the rise and fall of a vertical transfer clock during vertical transfer in the effective pixel period, and propagated to the n-type semiconductor substrate via channel stop regions of the light receiving portions and the image area P-well region. The crosstalk noises propagated to the image area P-well region are propagated to the output part P-well region. Crosstalk noises are therefore generated in an output signal of the CCD type solid-state imaging device due to the back gate effects. The back gate effects from the n-type semiconductor substrate are large because of depletion of a P-well region (region indicated by character X in FIG. 8) just under an n-channel of a MOS transistor in the FD region and on the drive side of a first stage source follower of an output circuit.

[4]

Figure 9:
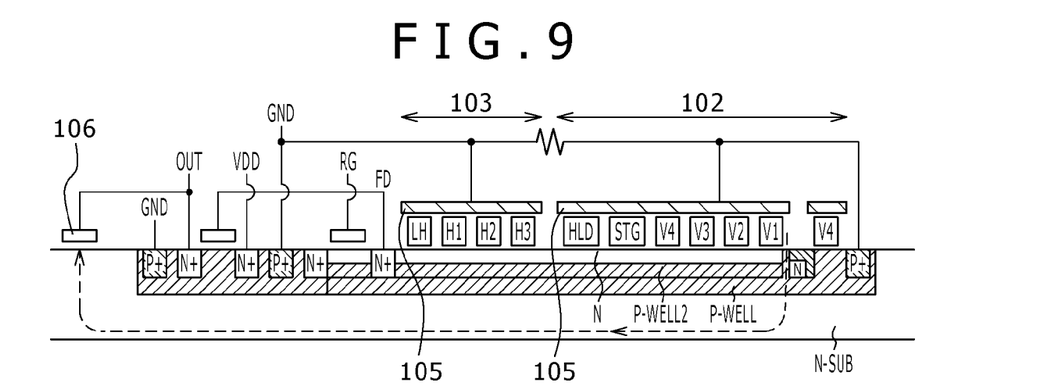
FIG. 9 is a diagram illustrating generation of crosstalk noises.

As shown in FIG. 9, crosstalk noises are generated in the image area at the rise and fall of a vertical transfer clock during vertical transfer in the effective pixel period, and propagated to the n-type semiconductor substrate via channel stop regions of the light receiving portions and the image area P-well region, and to output signal wirings and an output signal pad 106. The crosstalk noises are therefore generated in an output signal of the CCD type solid-state imaging device.

[5]

Figure 10A:
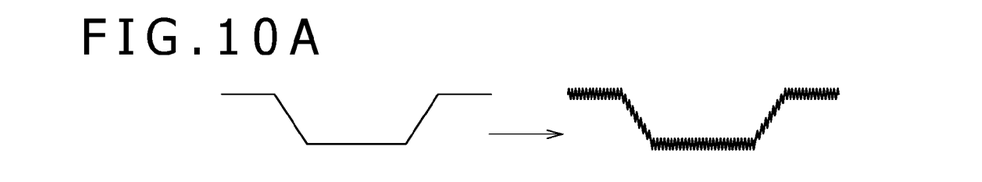
FIGS. 10A to 10C are diagrams illustrating generation of crosstalk noises.

As shown in FIG. 10A, high frequency components (high frequency noises) of the horizontal transfer clock are superposed upon the vertical transfer clock as coupling noises during vertical transfer in the effective pixel period.

Figure 10B:
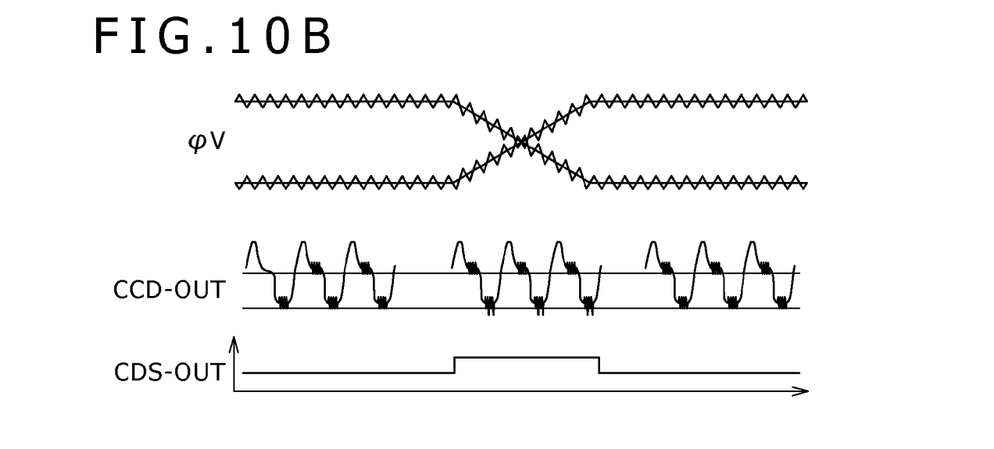
Figure 10C:
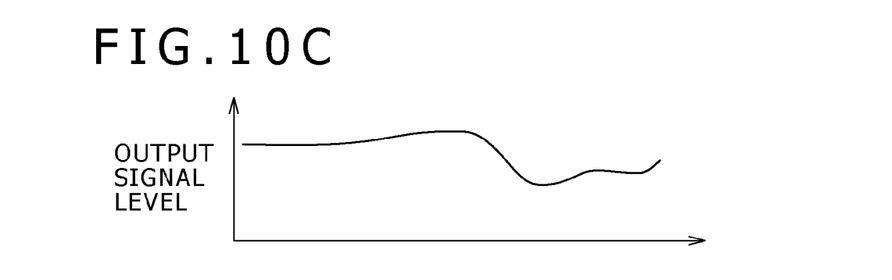

The coupling noises superposed upon the vertical transfer clock are propagated to the P-well region so that high frequency noises are superposed upon an output signal of the CCD type solid-state imaging device. As shown in FIG. 10B, high frequency noises have different waveforms between the ordinary state and transition state of the vertical transfer clock. Therefore, when an output signal level of an arbitrary line of an image frame is observed, a fluctuation of the output signal arises as shown in FIG. 10C.

Techniques of realizing a high frame rate by shortening greatly a horizontal blanking period have been proposed in Japanese Unexamined Patent Application Publication No. 2005-269060. According to the techniques, vertical transfer is performed during the effective pixel period, and a drive clock waveform is supplied to the vertical transfer registers of a CCD type solid-state imaging device during vertical transfer. The drive clock waveform has rise and fall slopes having a transient speed $\Delta V/\Delta T$ (where $\Delta V$ is a voltage and $\Delta T$ is a time) which allows a correlation double sampling circuit to eliminate crosstalk noises generated at the rise and fall of the drive clock waveform.

However, even by such techniques, crosstalk noises are not eliminated completely.

SUMMARY OF THE INVENTION

The present invention is addressed the above-identified issues associated with the developing technologies. One advantage of the present invention is to provide a solid-state imaging device and a solid-state imaging apparatus capable of suppressing image quality degradation, even if vertical transfer is performed during an effective pixel period.

In accordance with an embodiment of the present invention, there is provided a solid-state imaging device including: an imaging portion including a plurality of light receiving portions disposed in a matrix of rows and columns and a vertical transfer register, disposed in each vertical column of the matrix, for transferring electric charges transferred from the light receiving portions in a vertical direction; a horizontal transfer portion transferring electric charges transferred from the vertical transfer registers in a horizontal direction; an output part for outputting an electrical signal converted from electric charges transferred from the horizontal transfer portion, first reference potential applying means, and second reference potential applying means. The imaging portion, the horizontal transfer portion, and the output part are formed in a first conductivity type semiconductor substrate having a second conductivity type region, and a predetermined reference potential is applied to the second conductivity type semiconductor region. The first reference potential applying means applies a reference potential to the second conductivity type semiconductor region corresponding to an area where the output part is formed. The second reference potential applying means applies a reference potential to the second conductivity type semiconductor region corresponding to an area where the imaging portion is formed.

According to an embodiment of the present invention, the solid-state imaging device includes first reference potential applying means for applying a reference potential to the second conductivity type semiconductor region corresponding to an area where the output part is formed (hereinafter called an "output part second conductivity type semiconductor region") and second reference potential applying means for applying a reference potential to the second conductivity type semiconductor region corresponding to an area where the imaging portion is formed (hereinafter called an "imaging portion second conductivity type region"). Namely, reference potentials are applied to the output part second conductivity type semiconductor region and the imaging portion second conductivity type semiconductor region. Accordingly, a sufficient reference potential is applied to each of the output part second conductivity type semiconductor region and the imaging portion second conductivity type semiconductor region by applying a reference potential via a reference potential applying means different from the output part second conductivity type semiconductor region and the imaging portion second conductivity type semiconductor region, so that each region can be separated firmly. It is therefore possible to suppress the phenomenon that crosstalk noises generated in the imaging portion are propagated from the imaging portion second conductivity type semiconductor region to the output part second conductivity type semiconductor region.

The solid-state imaging device may include third reference potential applying means for applying a reference potential to the second conductivity type semiconductor region corresponding to an area where the horizontal transfer portion is formed (hereinafter called a "horizontal transfer portion second conductivity type semiconductor region"). Namely, reference potentials are applied to the output part second conductivity type semiconductor region, the imaging portion second conductivity type semiconductor region and the horizontal transfer portion second conductivity type semiconductor region, by different reference potential applying means, respectively. Accordingly, a sufficient reference potential is applied to each of the output part second conductivity type semiconductor region, the imaging portion second conductivity type semiconductor region and the horizontal transfer portion second conductivity type semiconductor region so that each region can be separated firmly. It is therefore possible to suppress the phenomenon that crosstalk noises generated in the imaging portion are propagated from the imaging portion second conductivity type semiconductor region to the horizontal transfer portion second conductivity type semiconductor region, the phenomenon that crosstalk noises are propagated from the imaging portion second conductivity type semiconductor region to the output part second conductivity type semiconductor region, and the phenomenon that crosstalk noises are propagated from the horizontal transfer portion second conductivity type semiconductor region to the output part second conductivity type semiconductor region.

The solid-state imaging device may include fourth reference potential applying means for applying a reference potential to the light shielding film for optically shielding the imaging portion. Namely, reference potentials are applied to the imaging portion second conductivity type semiconductor region and the imaging portion light shielding film by mutually different reference potential applying means. Accordingly, a sufficient reference potential is applied to each of the imaging portion second conductivity type semiconductor region and the imaging portion light shielding film, so that the respective regions can be separated firmly. It is therefore possible to suppress the phenomenon that crosstalk noises generated in the imaging portion are propagated from the imaging portion light shielding film to the imaging portion second conductivity type semiconductor region.

The output part second conductivity type semiconductor region is separated from the imaging portion second conductivity type semiconductor region by the horizontal transfer portion second conductivity type semiconductor region. Accordingly, it is possible to suppress the phenomenon that crosstalk noises generated in the imaging portion are propagated directly from the imaging portion second conductivity type semiconductor region to the output part second conductivity type semiconductor region.

The solid-state imaging device may include fifth reference potential applying means for applying a reference potential to the horizontal transfer portion light shielding film. Namely, reference potentials are applied to the imaging portion second conductivity type semiconductor region, the imaging portion light shielding film and the horizontal transfer portion light shielding film by mutually different reference potential applying means. Accordingly, a sufficient reference potential is applied to each of the imaging portion second conductivity type semiconductor region, the light shielding film for shielding the imaging portion and the light shielding film for shielding the horizontal transfer portion, so that the region and the light shielding films can be separated firmly. It is therefore possible to suppress the phenomenon that crosstalk noises generated in the imaging portion are propagated from the imaging portion light shielding film to the light shielding film.

The dose in the output part second conductivity type semiconductor region may be set larger than the dose in the imaging portion second conductivity type semiconductor region. It is therefore possible to suppress crosstalk noises from propagating from the first conductivity type semiconductor substrate to the output part second conductivity type semiconductor region. Similarly, the dose position of the output part second conductivity type semiconductor region may be set deeper than the dose position of in the imaging portion second conductivity type semiconductor region. It is therefore possible to suppress crosstalk noises from propagating from the first conductivity type semiconductor substrate to the output part second conductivity type semiconductor region.

The second conductivity type semiconductor region may be formed in an area corresponding to an area where an external terminal for outputting a signal converted by the output unit and an area where a wiring for connecting the output part and the external terminal is formed, and a reference potential may be applied to the second conductivity semiconductor region corresponding to the area where the external terminal and the wiring are formed. It is therefore possible to suppress crosstalk noises from propagating from the first conductivity type semiconductor substrate to the external terminal and wiring.

In accordance with another embodiment of the preset invention, there is provided a solid-state imaging apparatus which includes: a solid-state imaging device, a timing signal generator circuit, first reference potential applying means, and second reference potential applying means. The solid-state imaging apparatus includes an imaging portion having a plurality of light receiving portions disposed in a matrix of rows and columns and a vertical transfer register disposed in each vertical column of the light receiving portions for transferring electric charges transferred from the light receiving portions in a vertical direction; a horizontal transfer portion for transferring electric charges transferred from the vertical transfer registers in a horizontal direction; an output part for outputting an electrical signal converted from electric charges transferred from the horizontal transfer portion into an electric signal. The imaging portion, the horizontal transfer portion and the output part are formed in a first conductivity type semiconductor substrate having a second conductivity type region, and a predetermined reference potential is applied to the second conductivity type semiconductor region. The timing signal generator circuit applies a vertical transfer clock for driving the vertical transfer registers and a horizontal transfer clock for driving the horizontal transfer portion, to the solid-state imaging device. The first reference potential applying means applies a reference potential to the second conductivity type semiconductor region corresponding to an area where the output part is formed. The second reference potential applying means applies a reference potential to the second conductivity type semiconductor region corresponding to an area where the imaging portion is formed.

According to another embodiment of the present invention, the solid-state imaging apparatus includes first reference potential applying means for applying a reference potential to the output part second conductivity type semiconductor region and second reference potential applying means for applying a reference potential to the imaging portion second conductivity type semiconductor region. Accordingly, a sufficient reference potential is applied to each of the output part second conductivity type semiconductor region and imaging portion second conductivity type semiconductor region, so that each region can be separated firmly. It is therefore possible to suppress the phenomenon that crosstalk noises generated in the imaging portion are propagated from the imaging portion second conductivity type semiconductor region to the output part second conductivity type semiconductor region.

Wirings for applying the vertical transfer clock to the solid-state imaging device may be grounded via predetermined capacitors. It is possible to suppress a potential fluctuation of the second conductivity type semiconductor region. Further, wirings for applying the horizontal transfer clock to the solid-state imaging device may include ferrite beads, so that it is possible to suppress coupling noises.

In the solid-state imaging device and solid-state imaging apparatus according to embodiments of the present invention, a high frame rate can be realized without influence of crosstalk noises upon an image. A large number of pixels can be realized without lowering a frame rate.

DETAILED DESCRIPTION OF EMBODIMENTS

A better understanding of the present invention, embodiments of the present invention will be described with reference to the accompanying drawings.

Figure 1A:
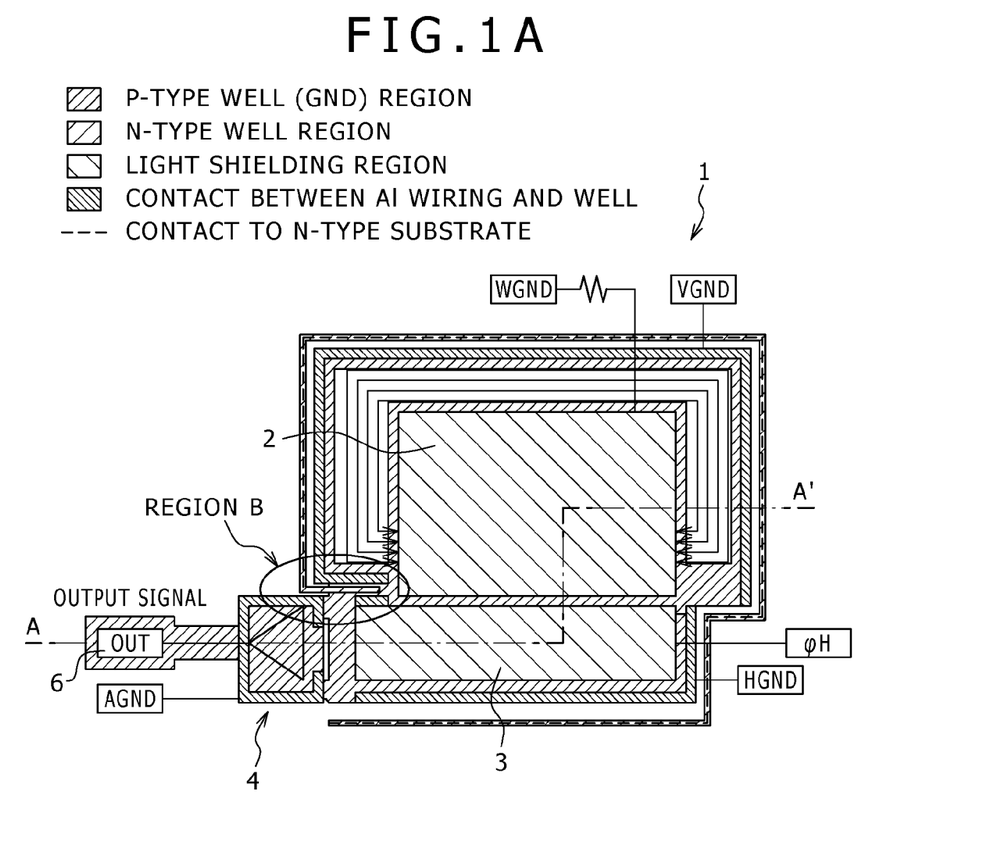
FIGS. 1A and 1B are schematic diagrams illustrating a CCD type solid-state imaging device adopting an embodiment of the present invention.
Figure 1B:
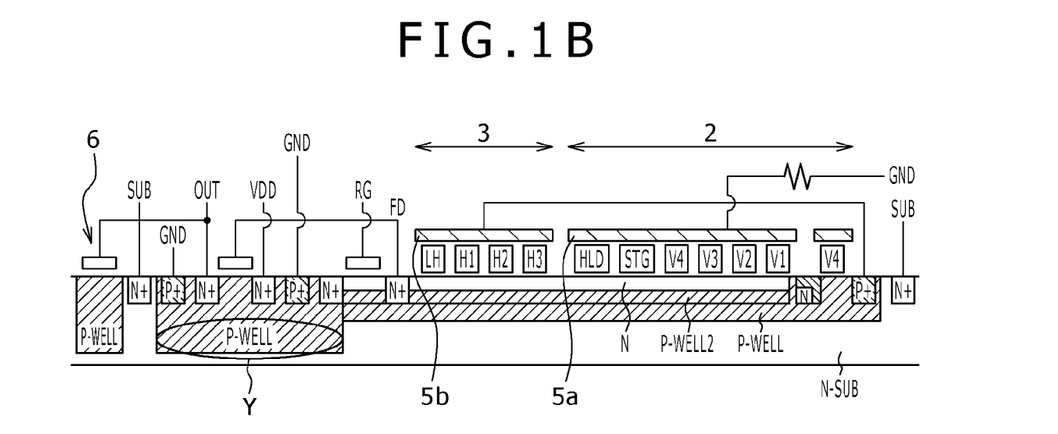

FIG. 1A is a schematic cross sectional view showing a CCD type solid-state imaging device as an example of a solid-state imaging device adopting an embodiment of the present invention, and FIG. 1B is a schematic cross section taken along line A-A' shown in FIG. 1A. This CCD type solid-state imaging device 1 is mainly constituted of an image area 2, a horizontal transfer portion 3 and an output part 4. The image area is constituted of light receiving portions (not shown) disposed in a matrix shape and a vertical transfer register (not shown) disposed in each vertical column of respective light receiving portions to transfer charges from respective light receiving portions. A first light shielding film 5a is formed above the image area, and a second light shielding film 5b is formed above the horizontal transfer portion. A pad 6 is formed for outputting an electric signal from an output part to an external. The pad and the output part are connected by an electrical wiring.

The CCD type solid-state imaging device is formed on an n-type semiconductor substrate (N-sub) having a P-well region. A ground potential is applied to the P-well region as a reference potential. A ground potential is applied to an image area p-well region from an image area p-well region ground (VGND). A ground potential is applied to an image area light shielding film from an image area light shielding film ground (WGND). A ground potential is applied to a horizontal transfer portion p-well region and the light shielding film of the horizontal transfer portion from a horizontal transfer portion region ground (HGND). A ground potential is applied to an output part P-well region and a P-well region corresponding to the pad and electric wirings from an output part ground (AGND).

A dose position of the output part P-well region (region indicated by character Y in FIG. 1B) is set deeper than a dose position of the image area P-well and a dose position of the horizontal transfer portion P-well region.

The reason why the dose position of the output part P-well region is set deeper than the dose position of the image area P-well and the dose position of the horizontal transfer portion P-well region, is to suppress the back gate effects caused by a potential change of the n-type semiconductor substrate. If the back gate effects caused by a potential change of the n-type semiconductor substrate is suppressed, it is not necessarily required that the dose position of the output part P-well region is set deeper than the dose position of the image area P-well and the dose position of the horizontal transfer portion P-well region. For example, the back gate effects caused by a potential change of the n-type semiconductor substrate may be suppressed, by setting a dose of the output part P-well region larger than a dose of the image area P-well and a dose of the horizontal transfer portion P-well region.

In the CCD type solid-state imaging device adopting an embodiment of the present invention, the ground potential is applied to the image area P-well region from VGND and to the image area light shielding film from WGND. It is therefore possible to suppress crosstalk noises described in [1].

Namely, in a known CCD type solid-state imaging device, the ground potential is applied to the image area light shielding film and the image area P-well region from the single ground potential (GND). In contrast, in the CCD type solid-state imaging device adopting an embodiment of the present invention, an image area light shielding pad is formed independently from an image area P-well region pad. The ground potential is applied to the image area P-well region from VGND, whereas the ground potential is applied to the image area light shielding film from WGND. It is therefore possible to suppress the phenomenon that crosstalk noises are propagated from the image area light shielding film to the image area p-well region, so that crosstalk noises described in [1] can be suppressed.

Further, in the CCD type solid-state imaging device adopting an embodiment of the present invention, the ground potential is applied to the image area P-well region from VGND, the ground potential is applied to the horizontal transfer portion P-well region from HGND, and the ground potential is applied to the output part P-well region from AGND. Separation of each region may be reinforced so that it is possible to suppress the phenomenon that crosstalk noises are propagated from the image area P-well region and horizontal transfer portion P-well region to the output part P-well region. Crosstalk noises described in [2] can therefore be suppressed.

Figure 2:
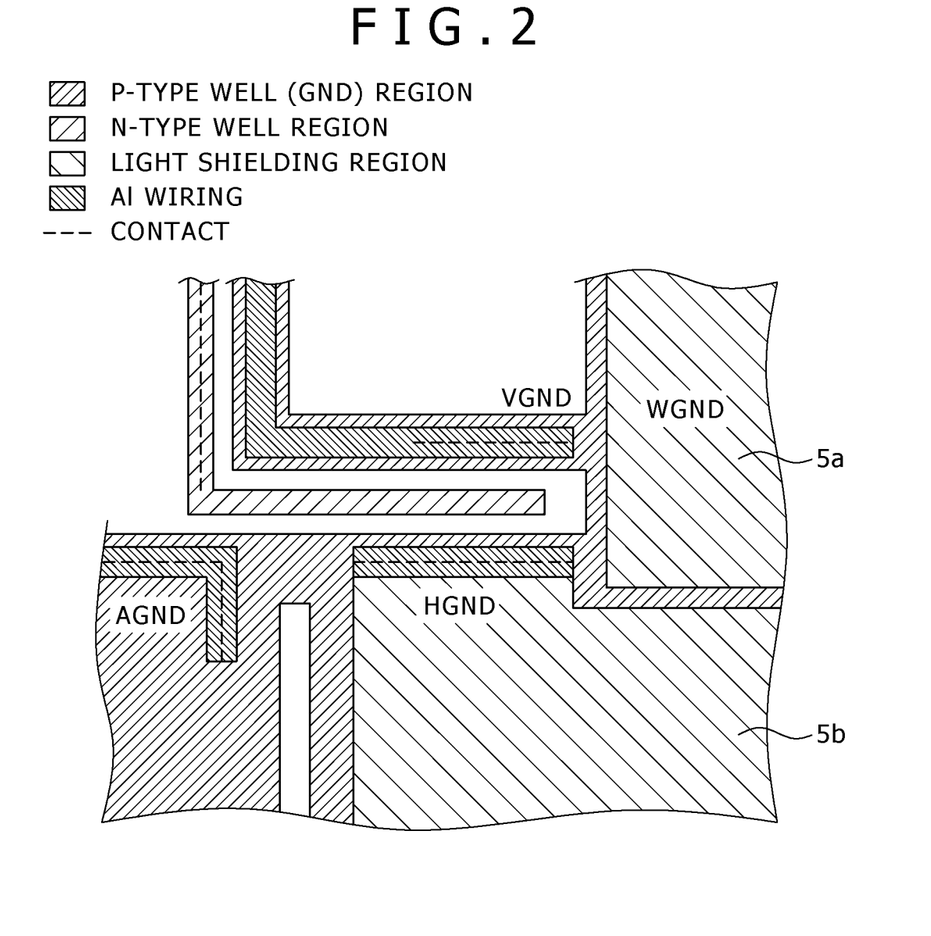
FIG. 2 is an enlarged view of an area indicated by character B in FIG. 1A.

In a region indicated by character B in FIG. 1A, the output part P-well region is positioned near at the image area P-well region. As shown in FIG. 2, the output part P-well region is separated from the image area P-well region by the horizontal transfer portion P-well region. It is therefore possible to suppress the phenomenon that crosstalk noises are propagated directly from the image area P-well region to the output part P-well region. The phenomenon that crosstalk noises are propagated directly from the image area P-well region to the output part P-well region can be suppressed further by forming a contact with the n-type semiconductor substrate applied with the ground potential, between the output part P-well region and image area P-well region.

Further, in the CCD type solid-state imaging device adopting an embodiment of the present invention, the dose position of the output part P-well region is set deeper than the dose position of the image area P-well region and the dose position of the horizontal transfer portion P-well region. Therefore, the back gate effects from the n-type semiconductor substrate can be suppressed and crosstalk noises described in [3] can be suppressed.

Figure 3A:
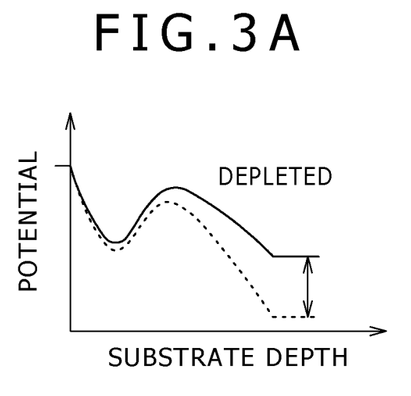
FIGS. 3A and 3B are graphs illustrating the back gate effects.
Figure 3B:
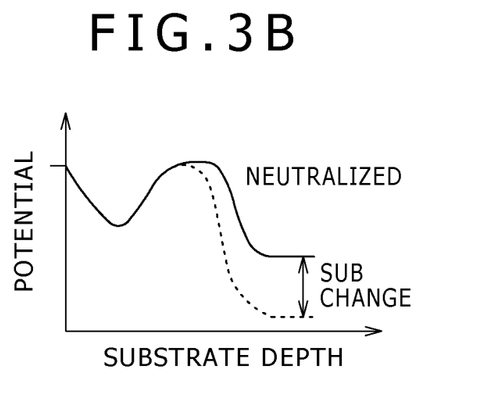

Namely, the known CCD type solid-state imaging device is susceptible (refer to FIG. 3A) to the back gate effects from the n-type semiconductor substrate, because of depletion of a P-well region just under an n-channel of a MOS transistor in the FD region and on the drive side of a first stage source follower of an output circuit. By setting the dose position of the output part P-well region deeper than the dose position of the image area P-well region and the dose position of the horizontal transfer portion P-well region, the back gate effects from the n-type semiconductor substrate can be suppressed (refer to FIG. 3B). Crosstalk noises described in [3] can therefore be suppressed.

Figure 4:
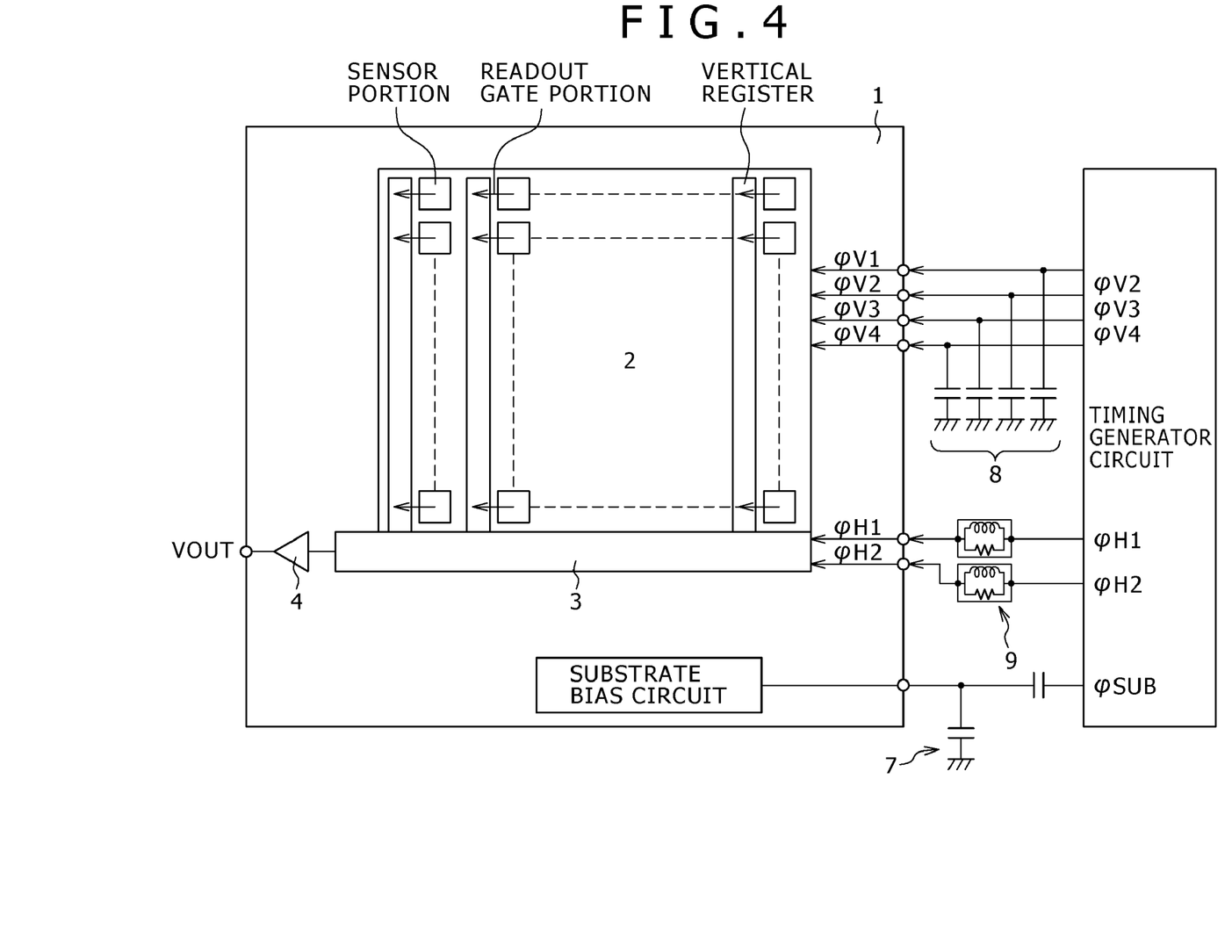
FIG. 4 is a schematic diagram illustrating a CCD type solid-state imaging apparatus adopting an embodiment of the present invention.

As shown in FIG. 4, by adding a ground capacitor 7 to a wiring for applying a substrate clock (●SUB) to a substrate bias circuit, coupling from the vertical transfer clock to the substrate clock is suppressed so that crosstalk noises due to propagation in the n-type semiconductor substrate can be suppressed.

Further, in the CCD type solid-state imaging device adopting an embodiment of the present invention, the ground potential is applied from AGND to the P-well region corresponding to the area where the pad and electrical wirings are formed. It is therefore possible to suppress crosstalk noises described in [4].

Namely, in the known CCD type solid-state imaging device, the P-well region is not formed in the area where the pad and electrical wirings are formed. However, in the CCD type solid-state imaging device adopting an embodiment of the present invention, the P-well region is formed in the area where the pad and electrical wirings are formed, and the ground potential is applied to the P-well region from AGND. It is therefore possible to shut down the propagation pass of crosstalk noises from the n-type semiconductor substrate to the pad and electrical wiring, and crosstalk noises described in [4] can be suppressed.

In a known CCD type solid-state imaging device, an N-well region is formed in an area corresponding to the pad for applying the horizontal transfer clock (refer to FIG. 5). By removing this N-well region, it becomes possible to shut down the pass via which crosstalk noises are propagated from the n-type semiconductor substrate to the horizontal transfer clock and from the horizontal transfer clock to the output signal.

Further, in the CCD type solid-state imaging device adopting an embodiment of the present invention, ground capacitors 8 are added to wirings for applying the vertical transfer clock to the vertical transfer registers so that a potential fluctuation of the P-well region can be suppressed and high frequency noises from the horizontal transfer clock can be reduced. By adding ferrite beads 9 having a function of absorbing high frequency noises and radiating the noises as heat, to wirings for applying the horizontal transfer clock to the horizontal transfer portion, coupling noises can be reduced. Crosstalk noises described in [5] can be suppressed by reducing high frequency noises and coupling noises.

It should be understood by those skilled in the art that various modifications, combinations, sub-combinations and alternations may occur depending on design requirements and other factors insofar as they are within the scope of the appended claims or equivalents thereof.

The present application claims benefit of priority of Japanese patent Application No. 2007-19356 filed in the Japanese Patent Office on Jan. 30, 2007, the entire contents of which are incorporated herein by reference.

What is claimed is:

1. A solid-state imaging device comprising:
an imaging portion including a plurality of light receiving portions disposed in a matrix of rows and columns, and a vertical transfer register, disposed in each column of the matrix, for transferring electric charges transferred from the light receiving portions in a vertical direction;
a horizontal transfer portion for transferring electric charges transferred from the vertical transfer registers in a horizontal direction;
an output part for outputting an electrical signal converted from electric charges transferred from the horizontal transfer portion;
wherein the imaging portion, the horizontal transfer portion and the output part are formed in a first conductivity type semiconductor substrate having a second conductivity type region, and a predetermined reference potential is applied to the second conductivity type semiconductor region;
first reference potential applying means for applying a reference potential to the second conductivity type semiconductor region corresponding to an area where the output part is formed; and
second reference potential applying means for applying a reference potential to the second conductivity type semiconductor region corresponding to an area where the imaging portion is formed.

2. The solid-state imaging device according to claim 1, further comprising third reference potential applying means for applying a reference potential to the second conductivity type semiconductor region corresponding to an area where the horizontal transfer portion is formed.

3. The solid-state imaging device according to claim 1, further comprising fourth reference potential applying means for applying a reference potential to the second conductivity type semiconductor region corresponding to an area where the imaging portion is formed.

4. The solid-state imaging device according to claim 2, wherein the second conductivity type semiconductor region corresponding to an area where the output part is formed is separated from the second conductivity type semiconductor region corresponding to an area where the imaging portion is formed, by the second conductivity type semiconductor region corresponding to an area where the horizontal transfer portion is formed.

5. The solid-state imaging device according to claim 3, further comprising fifth reference potential applying means for applying a reference potential to a light shielding film for optically shielding the horizontal transfer portion.

6. The solid-state imaging device according to claim 1, wherein the second conductivity type semiconductor region corresponding to an area where the output part is formed has a dose which is larger than that of the second conductivity type semiconductor region corresponding to an area where the imaging portion is formed.

7. The solid-state imaging device according to claim 1, wherein the second conductivity type semiconductor region corresponding to an area where the output part is formed has a dose position which is deeper than that of the second conductivity type semiconductor region corresponding to an area where the imaging portion is formed.

8. The solid-state imaging device according to claim 1, wherein the second conductivity type semiconductor region is formed in an area corresponding to an area where an external terminal for outputting a signal converted by the output unit and to an area where a wiring for connecting the output part and the external terminal is formed, and a reference potential is applied to the second conductivity semiconductor region corresponding to the area where the external terminal and the wiring are formed.

9. A solid-state imaging apparatus comprising:
a solid-state imaging device including: an imaging portion having a plurality of light receiving portions disposed in a matrix of rows and columns and a vertical transfer register, disposed in each column of the light receiving portions, for transferring electric charges transferred from the light receiving portions in a vertical direction, a horizontal transfer portion for transferring electric charges transferred from the vertical transfer registers in a horizontal direction; an output part for outputting an electrical signal converted from electric charges transferred from the horizontal transfer portion, wherein the imaging portion, the horizontal transfer portion and the output part are formed in a first conductivity type semiconductor substrate having a second conductivity type region, and a predetermined reference potential is applied to the second conductivity type semiconductor region;
a timing signal generator circuit for applying a vertical transfer clock for driving the vertical transfer registers and a horizontal transfer clock for driving the horizontal transfer portion, to the solid-state imaging device;

first reference potential applying means for applying a reference potential to the second conductivity type semiconductor region corresponding to an area where the output part is formed; and second reference potential applying means for applying a reference potential to the second conductivity type semiconductor region corresponding to an area where the imaging portion is formed.

10. The solid-state imaging apparatus according to claim 9, further comprising wirings for applying the vertical transfer clock to the solid-state imaging device, wherein the wirings are grounded via predetermined capacitors.

11. The solid-state imaging apparatus according to claim 9, further comprising wirings for applying the horizontal transfer clock to the solid-state imaging device, wherein the wirings include ferrite beads.

12. A solid-state imaging device comprising:

an imaging portion including a plurality of light receiving portions disposed in a matrix of rows and columns, and a vertical transfer register, disposed in each column of the matrix, for transferring electric charges transferred from the light receiving portions in a vertical direction;

a horizontal transfer portion for transferring electric charges transferred from the vertical transfer registers in a horizontal direction;

an output part for outputting an electrical signal converted from electric charges transferred from the horizontal transfer portion;

wherein the imaging portion, the horizontal transfer portion and the output part are formed in a first conductivity type semiconductor substrate having a second conductivity type region, and a predetermined reference potential is applied to the second conductivity type semiconductor region;

first reference potential applying portion configure to apply a reference potential to the second conductivity type semiconductor region corresponding to an area where the output part is formed; and second reference potential applying portion configured to apply a reference potential to the second conductivity type semiconductor region corresponding to an area where the imaging portion is formed.

13. A solid-state imaging apparatus comprising:

a solid-state imaging device including: an imaging portion having a plurality of light receiving portions disposed in a matrix of rows and columns and a vertical transfer register, disposed in each column of the light receiving portions, for transferring electric charges transferred from the light receiving portions in a vertical direction, a horizontal transfer portion for transferring electric charges transferred from the vertical transfer registers in a horizontal direction; an output part for outputting an electrical signal converted from electric charges transferred from the horizontal transfer portion, wherein the imaging portion, the horizontal transfer portion and the output part are formed in a first conductivity type semiconductor substrate having a second conductivity type region, and a predetermined reference potential is applied to the second conductivity type semiconductor region;

a timing signal generator circuit for applying a vertical transfer clock for driving the vertical transfer registers and a horizontal transfer clock for driving the horizontal transfer portion, to the solid-state imaging device;

first reference potential applying portion configure to apply a reference potential to the second conductivity type semiconductor region corresponding to an area where the output part is formed; and second reference potential applying portion configured to apply a reference potential to the second conductivity type semiconductor region corresponding to an area where the imaging portion is formed.

* * * * *